US012769219B2

(12) United States Patent
Hayashi

(10) Patent No.: US 12,769,219 B2
(45) Date of Patent: Oct. 20, 2026

(54) IMPRINT APPARATUS, IMPRINT METHOD, AND ARTICLE MANUFACTURING METHOD

(71) Applicant: CANON KABUSHIKI KAISHA, Tokyo (JP)

(72) Inventor: Nozomu Hayashi, Tochigi (JP)

(73) Assignee: CANON KABUSHIKI KAISHA, Tokyo (JP)

( * ) Notice: Subject to any disclaimer, the term of this patent is extended or adjusted under 35 U.S.C. 154(b) by 150 days.

(21) Appl. No.: 18/772,824

(22) Filed: Jul. 15, 2024

(65) Prior Publication Data

US 2025/0044714 A1 Feb. 6, 2025

(30) Foreign Application Priority Data

Aug. 3, 2023 (JP) ................................ 2023-127248

(51) Int. Cl.
*B29C 41/02* (2006.01)
*B29C 37/00* (2006.01)
(Continued)

(52) U.S. Cl.
CPC ........ *G03F 9/7042* (2013.01); *B29C 37/0053* (2013.01); *B29C 59/002* (2013.01);
(Continued)

(58) Field of Classification Search
CPC . B29C 37/0053; B29C 2037/90; B29C 41/02; B29C 41/38; B29C 41/52;
(Continued)

(56) References Cited

U.S. PATENT DOCUMENTS

| | | | | |
|---|---|---|---|---|
| 2014/0339721 A1* | 11/2014 | Toshima | ............... | G03F 7/0002 425/150 X |
| 2019/0285996 A1* | 9/2019 | Shibayama | ........... | G03F 7/0002 |
| 2021/0096462 A1* | 4/2021 | Ito | ......................... | G03F 7/0002 |

FOREIGN PATENT DOCUMENTS

| | | | |
|---|---|---|---|
| JP | 2021057511 A | | 4/2021 |
| KR | 1020140124836 A | | 10/2014 |

(Continued)

OTHER PUBLICATIONS

Office Action issued in Korean Appln. No. 10-2024-0098348 mailed on Mar. 24, 2026.

*Primary Examiner* — Leo B Tentoni
(74) *Attorney, Agent, or Firm* — ROSSI, KIMMS & McDOWELL LLP

(57) ABSTRACT

An imprint apparatus that can curb a decrease in throughput is provided. The imprint apparatus curs and forms a pattern of an imprint material sequentially in a plurality of shot areas on a substrate using a mold including a patterned part and includes: an alignment measurement unit configured to measure a relative position between the substrate and the mold by detecting a mark formed on the substrate and a mark formed on the mold; an alignment illumination unit including a light amount adjusting mechanism for adjusting a light amount of light emitted from a light source and configured to illuminate a marks on the mold and the substrate such that a marks are able to be detected by the alignment measurement unit; and a control unit configured to cure the imprint material in a state in which the mold and the substrate have been aligned on the basis of a measurement result from the alignment measurement unit and then to perform control such that adjustment of the light amount adjusting mechanism is started such that an illumination condition when the alignment illumination unit illuminates
(Continued)

a shot area on which a pattern is to be next formed is satisfied.

14 Claims, 7 Drawing Sheets

(51) Int. Cl.

| | |
|---|---|
| ***B29C 41/38*** | (2006.01) |
| ***B29C 41/52*** | (2006.01) |
| ***B29C 43/36*** | (2006.01) |
| ***B29C 59/00*** | (2006.01) |
| ***B29C 59/02*** | (2006.01) |
| ***G03F 7/00*** | (2006.01) |
| ***G03F 9/00*** | (2006.01) |
| *B29C 43/02* | (2006.01) |
| *B29C 43/58* | (2006.01) |

(52) U.S. Cl.
CPC ............ *B29C 59/02* (2013.01); *G03F 7/0002* (2013.01); *G03F 9/7023* (2013.01); *G03F 9/7065* (2013.01); *G03F 9/7069* (2013.01); *G03F 9/7088* (2013.01); *B29C 2037/90* (2013.01); *B29C 2043/025* (2013.01); *B29C 2043/5833* (2013.01); *B29C 2043/5891* (2013.01); *B29K 2907/00* (2013.01); *B29K 2909/08* (2013.01)

(58) Field of Classification Search
CPC .............. B29C 2043/025; B29C 43/36; B29C 2043/5833; B29C 2043/5891; G03F 7/0002; G03F 9/7023; G03F 9/7042; G03F 9/7065; G03F 9/7069; G03F 9/7088
USPC ....... 264/40.1, 259, 319, 408; 425/110, 135, 425/150, 169, 470; 356/399, 401
See application file for complete search history.

(56) References Cited

FOREIGN PATENT DOCUMENTS

| | | | |
|---|---|---|---|
| KR | 1020170121708 | A | 11/2017 |
| KR | 1020210039286 | A | 4/2021 |

* cited by examiner

IMPRINT APPARATUS, IMPRINT METHOD, AND ARTICLE MANUFACTURING METHOD

BACKGROUND OF THE INVENTION

Field of the Invention

The present invention relates to an imprint apparatus, an imprint method, and an article manufacturing method.

Description of the Related Art

Imprint technology is technology for enabling a pattern to be formed in a curable composition supplied onto a substrate using a mold. The imprint technology has been proposed as one lithography technique for mass-producing semiconductor devices, magnetic storage media, or the like. An imprint apparatus employing this imprint technology forms a pattern in a curable composition supplied onto a substrate using a mold. The imprint apparatus cures the curable composition in a state in which the mold and the curable composition have come into contact with each other and forms a pattern of the curable composition on the substrate by releasing the mold from the cured curable composition.

In an imprint apparatus, the mold and the substrate have to be accurately aligned when the mold and the curable composition are brought into contact with each other. In the imprint apparatus, for example, a die-by-die alignment system is employed as an alignment system. The die-by-die alignment system is a system for performing alignment by detecting alignment marks formed in a shot area on a substrate and alignment marks formed on a mold. This technology associated with alignment of a mold and a substrate has been proposed in the related art.

The detection accuracy of alignment marks is affected by illumination conditions for illuminating the alignment marks. Japanese Patent Laid-Open No. 2021-57511 discloses a method of optimizing illumination conditions for illuminating alignment marks in a plurality of shot areas.

However, as described in Japanese Patent Laid-Open No. 2021-57511, when illumination conditions such as wavelengths or light amount are changed according to the shot areas at the time of imprinting of the plurality of shot areas, there is a problem in that it takes time to change the illumination conditions and thus a throughput decreases.

SUMMARY OF THE INVENTION

Therefore, an objective of the present invention is to provide an imprint apparatus that can curb a decrease in throughput.

According to an aspect of the present invention, there is provided an imprint apparatus that cures and forms a pattern of an imprint material sequentially in a plurality of shot areas on a substrate using a mold including a patterned part, the imprint apparatus including: an alignment measurement unit configured to measure a relative position between the substrate and the mold by detecting a mark formed on the substrate and a mark formed on the mold; an alignment illumination unit including a light amount adjusting mechanism for adjusting a light amount of light emitted from a light source and configured to illuminate the marks on the mold and the substrate such that the marks are able to be detected by the alignment measurement unit; and a control unit configured to cure the imprint material in a state in which the mold and the substrate have been aligned on the basis of a measurement result from the alignment measurement unit and then to perform control such that adjustment of the light amount adjusting mechanism is started such that an illumination condition when the alignment illumination unit illuminates a shot area on which a pattern is to be next formed is satisfied.

Further features of the present invention will become apparent from the following description of exemplary embodiments with reference to the attached drawings.

DESCRIPTION OF THE EMBODIMENTS

Figure 1:
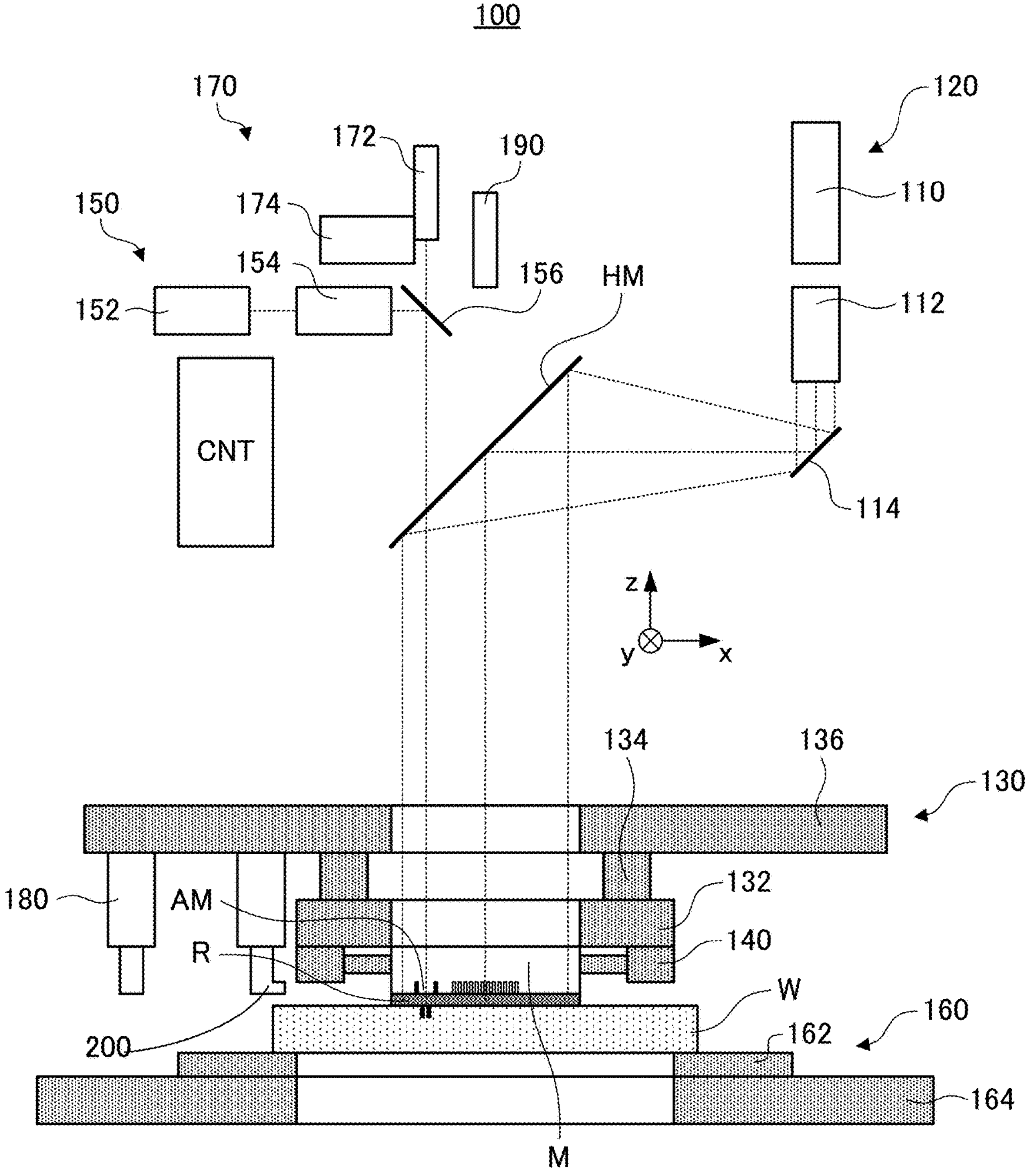
FIG. 1 is a diagram illustrating an imprint apparatus according to a first embodiment.

Hereinafter, exemplary embodiments of the present invention will be described with reference to the accompanying drawings using examples or drawings. In the drawings, the same members or elements will be referred to by the same reference signs, and repeated description thereof will be omitted or simplified. In the drawings, with respect to an imprint material R on a substrate W, a Z axis is defined to be parallel to an optical axis of an optical system 112, and an X axis and a Y axis perpendicular to each other are defined in a plane perpendicular to the Z axis.

First Embodiment

FIG. 1 is a diagram illustrating an imprint apparatus 100 according to a first embodiment. The imprint apparatus 100 according to the present embodiment will be described below with reference to FIG. 1. In the present embodiment, for example, the present invention is applied to a UV-curable imprint apparatus that cures an imprint material (a resin or a resist) R with irradiation through ultraviolet light (UV light). However, the present invention is not limited thereto and can also be applied to an imprint apparatus that cures the imprint material R through irradiation with light of another wavelength range or an imprint apparatus that cures a resin using other energy (for example, heat).

A substrate W is, for example, a single-crystal silicon substrate or a silicon on insulator (SOI) substrate, and an imprint material R which is shaped in a pattern by a patterned part formed in a mold M is applied to a processing surface thereof. The substrate W may employ various substrates such as a gallium arsenide wafer, a compositely adhered wafer, a glass wafer including quartz as a material, a liquid crystal panel substrate, and a reticle. An outer shape thereof may be rectangular as well as circular. In this case, the outer shape of a substrate chuck 162 can be set to a shape corresponding to the outer shape of the substrate W.

A mold (a mold or an original plate) M has a rectangular outer shape and includes a patterned part (a mesa part) including a pattern (a protruded/recessed pattern to be transferred to the substrate W such as a circuit pattern) formed in a three-dimensional shape on a surface (a pattern surface) facing the surface of the substrate W. The mold M is formed of a material that can transmit irradiation light such as UV light, for example, quartz. The mold M may include a cavity with a circular planar shape and with a certain depth in the surface irradiated with irradiation light. The mold M is carried by a delivery mechanism which is not illustrated. The delivery mechanism includes, for example, a delivery robot including a chuck such as a vacuum chuck.

The imprint material R is a photo-curable resin having a property that the resin is cured by irradiation with illumination light such as UV light and is appropriately selected according to various conditions of a semiconductor device manufacturing process or the like. The photo-curable resin contains at least a polymerizable compound and a photopolymerization initiator and may further contain a non-polymerizable compound or a solvent according to necessity. The imprint material R may be added in a film form to a substrate W by a spin coater or a slit coater when the imprint material R is added (applied) to the substrate W.

The imprint apparatus 100 according to the present embodiment is configured to sequentially form a pattern of the imprint material R in a plurality of shot areas (a pattern-formed area or an imprint area) of the substrate W by repeating an imprint shot cycle. Here, one imprint shot cycle is a cycle in which a pattern of the imprint material is formed in one shot area on the substrate W by curing the imprint material R in a state in which the mold M is impressed on the imprint material R. This series of processes is also referred to as an imprinting process. This imprinting process will be described below.

First, the mold M and the substrate W are positioned with a predetermined positional relationship, then the mold chuck 132 is moved in the −Z direction, and the patterned part of the mold M is brought into contact with the imprint material R in a shot area (a contact step). Then, the imprint material R is cured in a state in which the patterned part of the mold M is brought into contact with the imprint material R (a curing step). Then, the patterned part of the mold M is separated from the imprint material R of the shot area (a release step). A pattern of an imprint material can be formed on the substrate W by performing this series of steps. This imprinting process is performed for each shot area in which a pattern is formed on the substrate W. The imprinting process may include a step of applying (supplying) the imprint material R to the shot area of the substrate W (an application step) before the contact step.

The imprint apparatus 100 according to the present embodiment includes a light irradiation mechanism 120, a mold operating mechanism 130, a mold shape correcting mechanism 140, an alignment illumination mechanism 150, a substrate drive unit 160, an alignment mechanism 170, and a control unit CNT.

The light irradiation mechanism 120 cures the imprint material R by irradiating the imprint material (resist) R with UV light via the mold M. The light irradiation mechanism 120 includes a light source unit 110 and an optical system 112.

The light source unit 110 includes a light source such as a halogen lamp for generating UV light (for example, an i-line and a g-line) and an elliptical mirror for condensing light generated by the light source. The optical system 112 includes a lens, a half mirror HM, and a mirror 114 for irradiating the imprint material R in a shot area with light for curing the imprint material R. The optical system 112 may include an optical integrator for uniformly irradiating the mold M. Light of which a range is defined by an aperture is incident on the imprint material R on the substrate W via an imaging optical system and the mold M. An overall shot area observation scope 190 is a scope for observing the overall shot area and is used to ascertain an imprinting state or an impression or filling status.

The mold operating mechanism 130 includes a mold chuck (a mold holder) 132 for holding the mold M, a mold drive mechanism 134 for driving the mold M by driving the mold chuck 132, and a base 136 for supporting the mold drive mechanism 134.

The mold drive mechanism 134 includes a positioning mechanism for controlling the position of the mold M in six axes and a mechanism for impressing the mold M on the substrate W or the imprint material M thereon or releasing the mold M from the cured imprint material R. Here, six axes include an X axis, a Y axis, and a Z axis in the XYZ coordinate system with an XY plane which is a support plane of the mold chuck 132 (a plane supporting the substrate W) and with the Z axis which is a direction perpendicular thereto and rotations of the axes.

The mold shape correcting mechanism 140 can be mounted in the mold chuck 132. The mold shape correcting mechanism 140 can correct a shape of the mold M by pressing the mold M from the outer circumference side, for example, using a cylinder that operates with a fluid such as air or oil. Alternatively, the mold shape correcting mechanism 140 includes a temperature control unit for controlling the temperature of the mold M and corrects the shape of the mold M by controlling the temperature of the mold M. The substrate W can be deformed (for example, expanded or contracted) through a process such as heat treatment. The mold shape correcting mechanism 140 corrects the shape of the mold M such that an overlay error is in a tolerable range with deformation of the substrate W.

The application mechanism 180 sequentially applies (supplies) the imprint material R to areas on which the imprinting process is to be performed on the substrate W. Alternatively, the application mechanism 180 may apply the imprint material to the whole surface of the substrate W. The imprint material R may be applied using the application mechanism 180 provided in the imprint apparatus 100, or the imprint material R may be applied to the whole surface using an external apparatus. In this case, the substrate W in which the imprint material R has been applied to the whole surface of the substrate W is delivered into the imprint apparatus. The application mechanism 180 includes, for example, a tank in which a resin is accommodated, a nozzle for ejecting the resin supplied from the tank via a supply line to a substrate, a valve that is provided in the supply line, and a supply control unit.

A gas supply mechanism 200 is a mechanism for supplying gas such as helium (He) into a space of the mold operating mechanism 130 to prompt filling with the imprint material R. An amount of gas flowing therein is optimized in advance according to an imprint shot cycle.

The substrate drive unit 160 includes, for example, a substrate chuck 162 for holding the substrate W, a substrate stage 164 for driving the substrate W by driving the substrate chuck 162, and a stage drive mechanism which is not illustrated. The stage drive mechanism includes a positioning mechanism for controlling the position of the substrate W by controlling the position of the substrate stage 164 with respect to the aforementioned six axes. The substrate chuck 162 holds the substrate W using a vacuum suction pad or the like.

Figure 2:
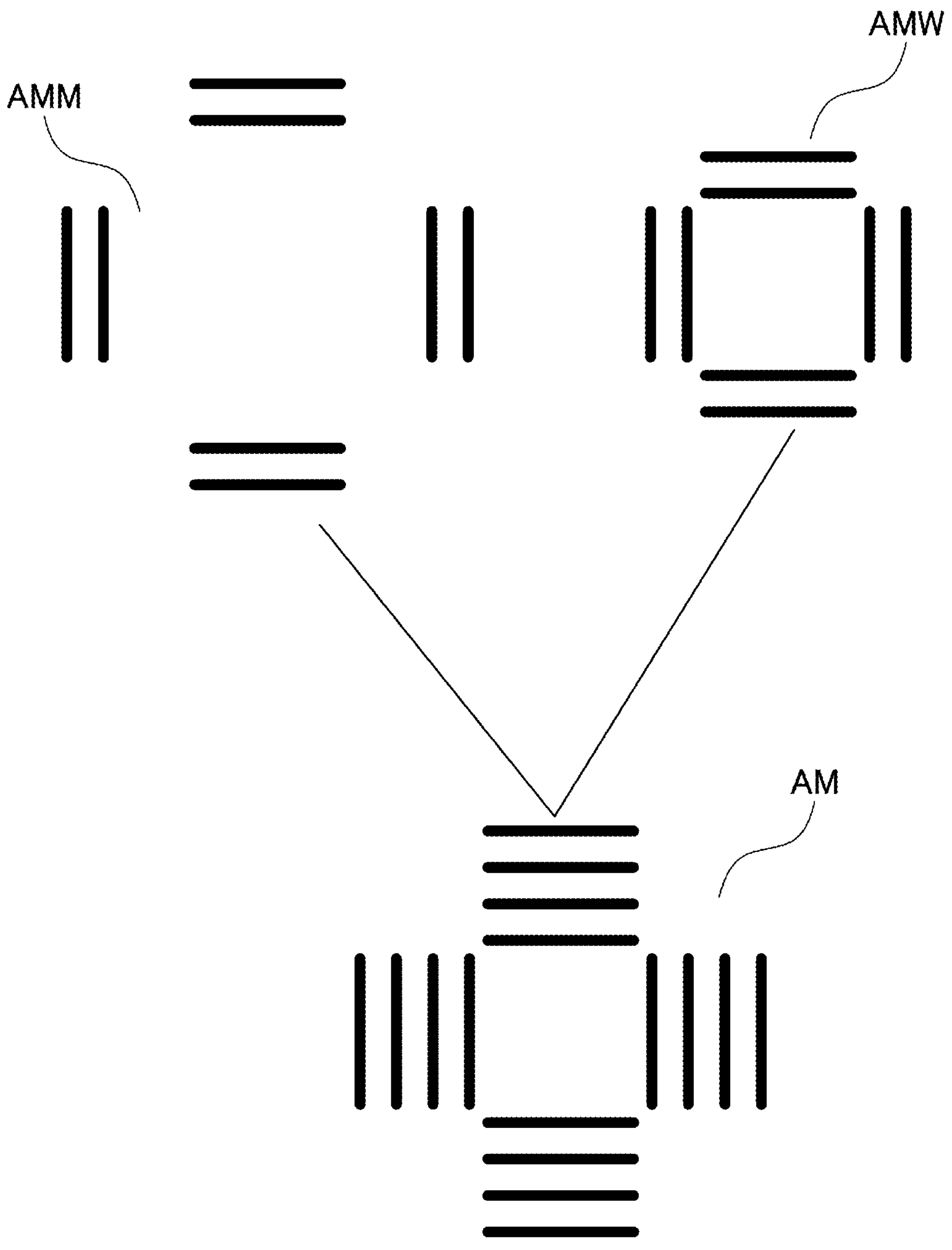
FIG. 2 is a diagram illustrating an example of alignment marks according to the first embodiment.

FIG. 2 is a diagram illustrating alignment marks formed on the mold M and the substrate W. Alignment marks AMM in FIG. 2 are alignment marks for the mold M. Alignment marks AMW are alignment marks for the substrate W. The alignment marks AMM on the mold M and the alignment marks AMW on the substrate W are formed in shapes which do not fully overlap each other such that relative positions with respect to the alignment marks AMW on the substrate W can be measured through the mold M. By measuring the positions of the alignment marks AMM and AMW (the alignment marks AM) in the field of view of an alignment scope 172, relative positions between the alignment scope 172 and the alignment marks AMM or AMW can be measured using the alignment scope 172. The alignment marks illustrated in FIG. 2 are alignment marks when seen from the +Z-axis side to the −Z-axis side. The alignment marks are not limited to the pattern illustrated in FIG. 2, and a moire fringe which is generated by using a diffractive lattice as the alignment marks may be detected.

The alignment illumination mechanism (an alignment illumination unit) 150 is an illumination mechanism for illuminating the alignment marks AM on the substrate W such that the alignment marks can be detected using the alignment scope 172. The alignment illumination mechanism 150 includes a light source 152, a light amount adjusting mechanism 154, a half mirror 156, and an adjustment unit (not illustrated). The light source 152 is constituted by, for example, a laser diode or the like that can emit light (alignment light).

The light amount adjusting mechanism 154 adjusts a light amount of light that is emitted from the light source 152. The light amount adjusting mechanism 154 according to the present embodiment is a mechanism that includes a plurality of areas with different transmittances and can continuously change a transmittance. Illumination conditions which are conditions for enabling the alignment scope 172 to perform measurement in an optimal state which will be described later can be set by adjusting the transmittance by driving the light amount adjusting mechanism 154. The light amount adjusting mechanism 154 may be a continuously variable ND filter of which a transmittance can be changed according to a position transmitting light, a liquid crystal ND filter of which a transmittance can be electrically controlled with application of a voltage, or the like. The half mirror 156 has an optical axis matching that of the alignment mechanism 170. The adjustment unit which is not illustrated includes a wavelength filter, a photosensitive filter, a filter for changing a shape of an irradiation area, and a light flux shaping unit. Accordingly, the adjustment unit can adjust (change) illumination conditions (a light amount, a wavelength, and a shape of illumination light) of the alignment marks of the mold M and the substrate W. The adjustment unit also serves as an illumination means (an adjustment means) for adjusting the illumination conditions.

The alignment mechanism (an alignment detection system) 170 includes, for example, an alignment scope (alignment measurement unit) 172 and an alignment stage mechanism 174. The alignment mechanism 170 is a mechanism for measuring relative positions between marks formed on the mold M and marks formed on the substrate W using the alignment scope 172. Only one alignment mechanism 170 is illustrated in FIG. 1, but this is only an example. A plurality of alignment mechanisms 170 are mounted in the imprint apparatus 100.

The alignment scope 172 includes an automatic adjustment scope (AAS) for aligning an image sensor, the mold M, and a shot area of the substrate W. The alignment scope 172 measures a relative position between the substrate W and the mold M by detecting the alignment marks AMM formed on the mold M and the alignment marks AMW formed on the substrate W via the mold M.

For example, the alignment scope 172 repeatedly captures and acquires an image of the alignment marks AM in a set accumulation time and then transmits the acquired image to the control unit CNT. Specifically, alignment light emitted from the light source 152 of the alignment illumination mechanism 150 is reflected by the half mirror 156, is transmitted by the mold M, and is applied to the alignment marks AM. Then, the alignment light reflected by the alignment marks AM forms an optical image on an imaging surface of an image sensor of the alignment scope 172, and the optical image can be captured by the image sensor. The alignment scope 172 outputs the image acquired through imaging to the control unit CNT. Thereafter, the control unit CNT calculates an alignment mark relative position between the mold M and the substrate W on the basis of the image. The control unit CNT measures a difference in pattern shape (such as coordinates, rotations, magnifications, and a trapezoidal component) between the mold M and the substrate W on the basis of the measurement result of the alignment mark relative position. Then, the control unit CNT calculates an amount of drive to be instructed to the substrate drive unit 160 on the basis of the measurement result.

Calculation of the alignment mark relative position may be performed by an image processing apparatus or the like which is not illustrated. The image processing apparatus may be unified with (provided in the same casing as) another constituent of the imprint apparatus 100. The image processing apparatus may be provided separately from (provided in different casings from) another part of the imprint apparatus 100, or may be provided at a place different from the imprint apparatus 100 and may be remotely controlled.

The control unit CNT includes a CPU and a memory (a storage unit) and is constituted by at least one computer. The control unit CNT is connected to the constituents of the imprint apparatus 100 via lines. The control unit CNT comprehensively controls operations, adjustments, and the like of the constituents of the imprint apparatus 100 as a whole in accordance with a program (a computer program) stored in the memory. The control unit CNT may be unified with (provided in the same casing as) another constituent of the imprint apparatus 100. The control unit CNT may be provided separately from (provided in different casings from) another part of the imprint apparatus 100, or may be provided at a place different from the imprint apparatus 100 and may be remotely controlled.

The imprint apparatus 100 further includes a surface plate and an anti-vibrator (a damper) which are not illustrated. The surface plate supports the imprint apparatus 100 as a whole and forms a reference plane when the substrate stage 164 moves. The anti-vibrator damps vibration from the floor and supports the surface plate.

Figure 3:
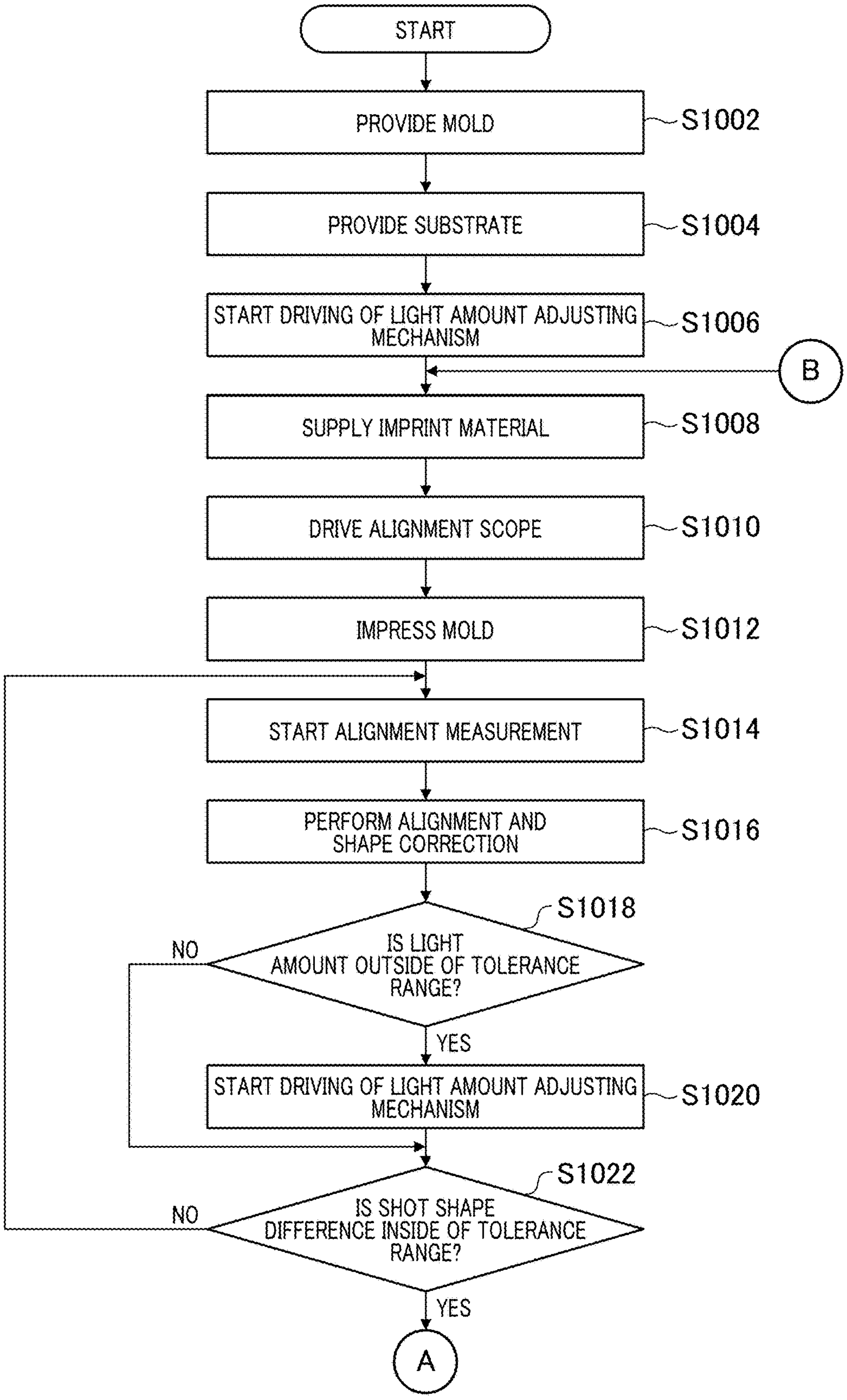
FIG. 3 is a flowchart illustrating an imprint process that is performed by the imprint apparatus according to the first embodiment.
Figure 4:
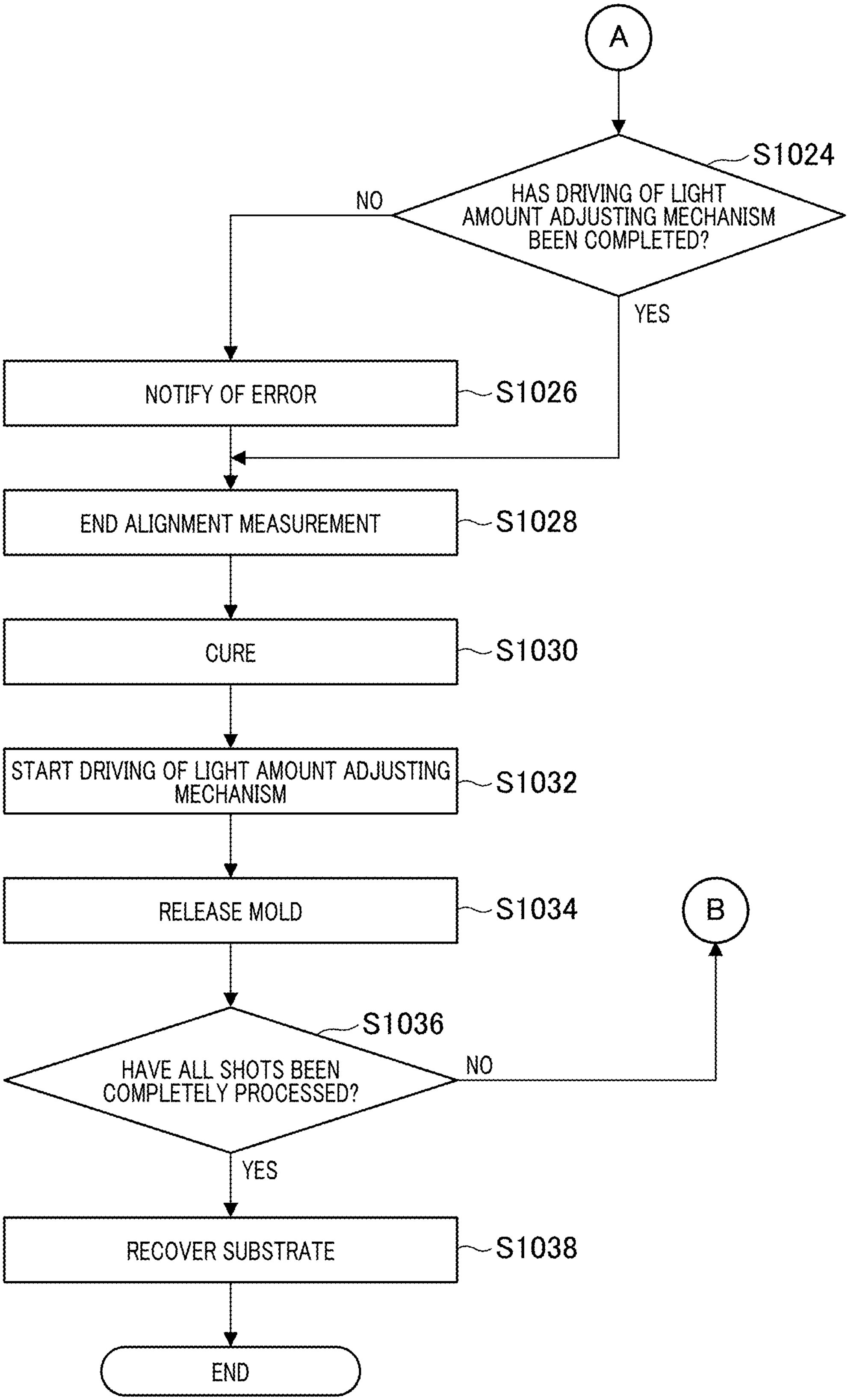
FIG. 4 is a flowchart illustrating an imprint process that is performed by the imprint apparatus according to the first embodiment.
Figure 5:
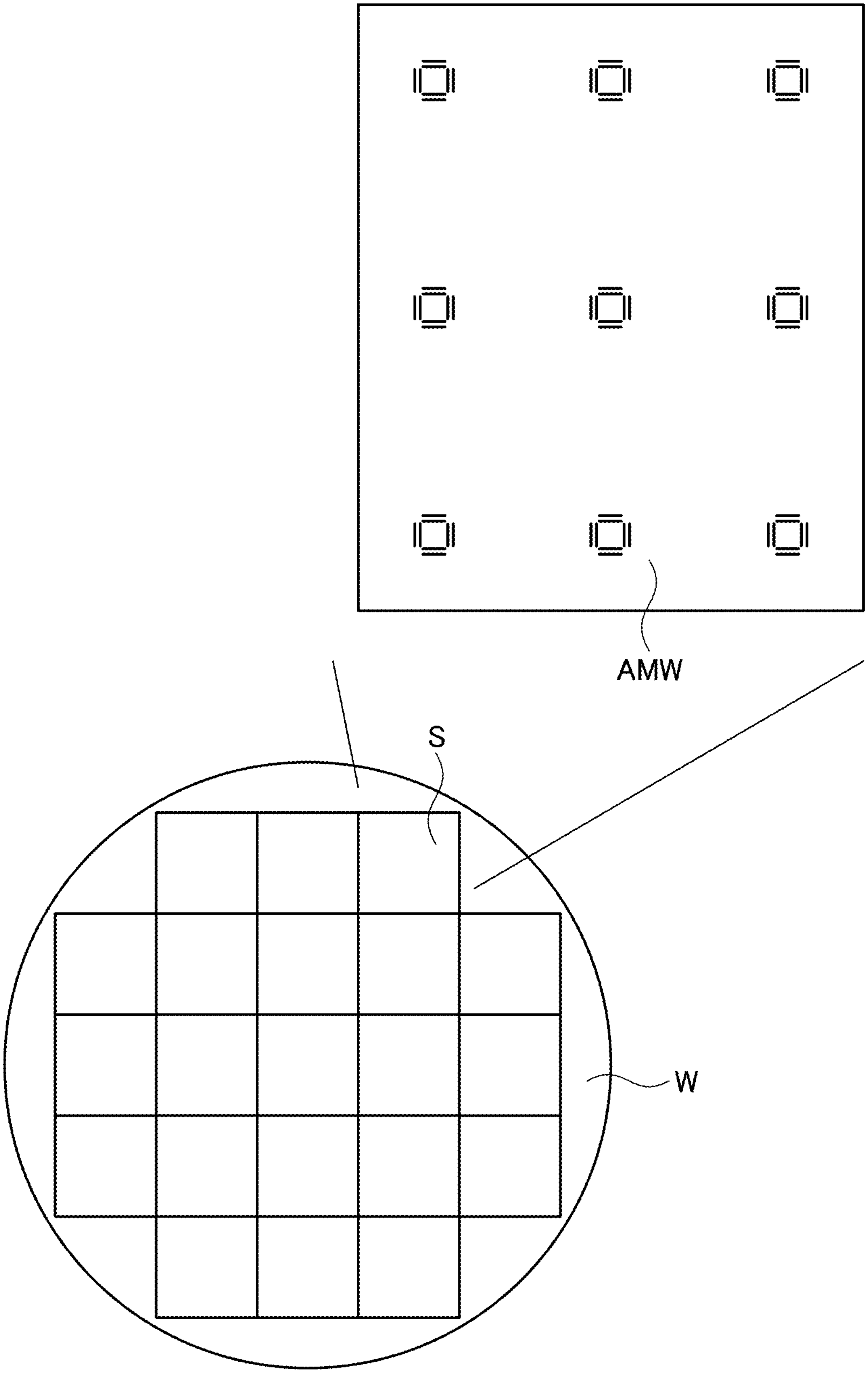
FIG. 5 is a diagram illustrating an example of a substrate and an arrangement of shot areas.
Figure 6:
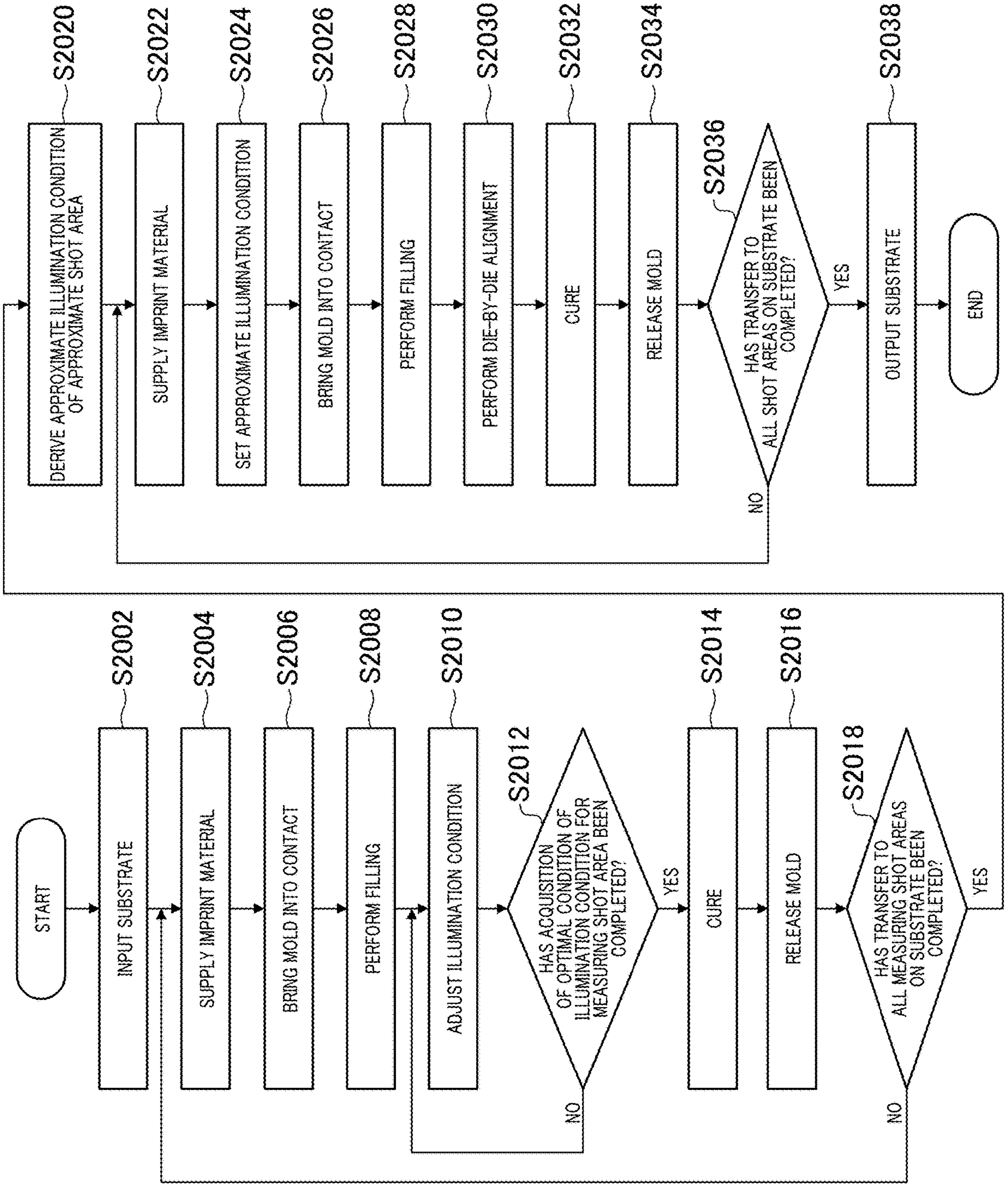
FIG. 6 is a flowchart illustrating an example of a process of setting optimal illumination conditions for correctly capturing an image of alignment marks.

Operations (processes) that are performed by the imprint apparatus 100 according to the present embodiment will be described below with reference to FIGS. 3 to 6. FIGS. 3 and 4 are flowcharts illustrating an imprinting process that is performed by the imprint apparatus 100 according to the present embodiment. FIG. 5 is a diagram illustrating an example of a substrate W and an arrangement of shot areas. S in FIG. 5 indicates a shot area. A plurality of shot areas S are formed on the substrate W, and a plurality of alignment marks AMW are formed in each shot area S. FIG. 6 is an example of a flowchart illustrating a method of setting an optical illumination condition for correctly capturing an image of the alignment marks AM.

The processes illustrated in FIGS. 3 and 4 are realized by causing the control unit CNT of the imprint apparatus 100 to execute a program stored in the memory. Description of steps will be omitted by prefixing S to the head of each step.

First, in S1002, a mold M is delivered to the mold chuck 132, and a position thereof is determined. Thereafter, the mold M is held by the mold chuck 132. Then, in S1004, a substrate W is delivered into an apparatus by a delivery mechanism which is not illustrated and is placed (loaded) onto the substrate chuck 162. Thereafter, the substrate W is held by the substrate chuck 162. For example, it is assumed that at least one layer of pattern is formed already along with alignment marks AMW.

Then, in S1006, the control unit CNT controls the light amount adjusting mechanism 154 and starts driving for changing a transmittance such that an illumination condition for illuminating the alignment mechanism 170 is satisfied. When changing of the transmittance is performed, an optimal illumination condition for correcting capturing an image of the alignment marks AM is investigated in advance. Investigation of the optimal illumination condition will be described below. First, an illumination condition for alignment marks on a mold and a substrate which is optimal for die-by-die alignment is acquired from a plurality of shot areas using an adjustment substrate (a first substrate). At the time of acquirement, the illumination condition for the alignment marks of the mold and the substrate is adjusted and is acquired as the optimal illumination condition. Here, it is assumed that a shot area from which the optimal illumination condition has been acquired is defined as a measuring shot area (a first shot area).

After the optimal illumination condition has been acquired, the imprinting process is performed on the measuring shot area. Here, it is assumed that a shot area from which the illumination condition has not been acquired is defined as an approximate shot area (a second shot area). As the illumination condition for the approximate shot area, an approximate illumination condition is derived and acquired from the optimal illumination condition obtained by performing adjustment on a plurality of measuring shot areas using a function (for example, using function approximation). The imprinting process including a step of performing die-by-die alignment based on the derived approximate illumination condition is performed on the approximate shot area.

When the imprinting process of the adjustment substrate ends, the imprinting process including a step of performing die-by-die alignment based on the acquired illumination condition (the optimal illumination condition and the approximate illumination condition) is performed on a product substrate (a second substrate). Here, the product substrate is a substrate W according to the present embodiment. The substrate W is preferably a product substrate, but the adjustment substrate may be used as the product substrate without any change. The illumination condition for the alignment marks on the mold M and the substrate W mainly depends on reflection characteristics and shapes of the alignment marks AMW formed on the substrate W. Accordingly, a product substrate is prepared to have the same (or substantially the same) reflection characteristics and shapes as the adjustment substrate. The product substrate is prepared such that other conditions such as application unevenness of a planarization film applied to the substrate W are the same (or substantially the same). The adjustment substrate may be prepared separately from the product substrate, or these two substrates may be selected from the same lot. That is, a first substrate in the same lot may be used as the adjustment substrate and a second substrate may be used as the product substrate.

Setting of an optimal illumination condition will be described below with reference to FIG. 6. The following processes are realized by causing the control unit CNT of the imprint apparatus 100 to execute a program stored in the memory. Description of steps will be omitted by prefixing S to the head of each step First, in S2002, the control unit CNT controls a delivery apparatus (not illustrated) such that an adjustment substrate is delivered. Then, in S2004, the control unit CNT controls the application mechanism 180 such that an imprint material R is supplied onto the delivered adjustment substrate and the alignment marks AMW formed in a plurality of measuring shot areas of the adjustment substrate. The control unit CNT controls the mold drive mechanism 134 or the substrate stage 164 such that the adjustment substrate supplied with the imprint material R moves just below the mold M.

Then, in S2006, the control unit CNT controls the mold drive mechanism 134 such that the imprint material R supplied onto the adjustment substrate and the alignment marks AMW formed on the adjustment substrate are brought into contact with the mold M and the alignment marks AMM of the mold M. At this time, the mold M may be deformed to be convex to the adjustment substrate and brought into contact with the imprint material. Then, in S2008, the control unit CNT controls the mold drive mechanism 134 or the substrate stage 164 such that contact between the mold M and the imprint material R is maintained. Then, the patterned part (recesses of the protruded/recessed pattern) of the mold M is filled with the imprint material R such that the alignment marks or a moire fringe can be observed by the alignment scope 172.

Then, in S2010, the illumination condition is adjusted such that the illumination condition for the alignment marks on the mold M and the adjustment substrate is optimized to acquire the optimal illumination condition (a first illumination step). The control unit CNT compares the alignment mark determined to be observed in S2008 with a predetermined alignment mark or compares the shape of the moire fringe with a shape of a predetermined moire fringe and controls an adjustment unit which is not illustrated on the basis of the comparison result. The alignment marks AMM and the alignment marks AMW are illuminated, and the illumination condition (such as a light amount, a wavelength, and a pattern matching template) is adjusted. In adjustment of the illumination condition, the pattern of the alignment marks of the mold and the pattern of the alignment marks of the substrate may be adjusted in an imaging period (an accumulation time), for example, using an image sensor. For each of the plurality of shot areas, alignment between the alignment marks AMM and the alignment marks AMW (a first alignment step) is performed while adjusting the illumination condition in the first illumination step. When the illumination condition is set using a moire fringe, the contrast of the moire fringe is affected by a light amount or a wavelength, and thus the illumination condition is adjusted such that the contrast increases. The control unit CNT compares the alignment mark observed under the adjusted illumination condition with a predetermined alignment mark or compares the shape of the moire fringe with a shape of a predetermined moire fringe.

Then, in S2012, the control unit CNT determines whether the illumination condition adjusted in S2010 is within a predetermined threshold range. When the illumination condition adjusted in S2010 is within the predetermined threshold range, the illumination condition is acquired as an optimal illumination condition, and the process flow proceeds to S2014. On the other hand, when the illumination condition adjusted in S2010 is not within the predetermined threshold range, the process flow returns to S2010, and the comparison process is repeated while adjusting the illumination condition until the comparison result is within the predetermined threshold range.

The illumination condition (the optimal illumination condition) when the comparison result is within the predetermined threshold range is recorded in a recording medium such as a memory. The illumination condition (the optimal illumination condition) may be stored in a storage medium such as a secondary storage device connected to the imprint apparatus 100 in a wired or wireless manner.

The optimal illumination condition varies depending on the shot areas and thus is calculated for each shot area. Here, the measuring shot area from which the optimal illumination condition is calculated may not be all the shot areas on the substrate and the number of measuring shot areas may be set to a number required for deriving an approximate illumination condition in S2020 which will be described later. For example, only the shot areas located at the center of the substrate and in the periphery of the substrate may be selected as the measuring shot areas. The measuring shot areas may be selected in advance or dynamically changed according to the calculated optimal illumination condition. For example, when a difference in the optimal illumination condition between two neighboring measuring shot areas is greater than a predetermined threshold value, dynamic control may be performed such that a shot area at a position interposed between the two shot areas is set as a new measuring shot area. All the shot areas on the substrate may be set as the measuring shot areas from which the optimal illumination condition is calculated.

Then, in S2014, the control unit CNT controls the light irradiation mechanism 120 such that the imprint material R is cured by irradiating the imprint material R with UV light in a state in which the patterned part of the mold M is brought into contact with the imprint material R. Then, in S2016, the mold drive mechanism 134 or the substrate stage 164 is controlled such that the mold M is released from the cured imprint material R (separated from the mold M). Then, in S2018, the control unit CNT determines whether the imprinting process on all the measuring shot areas on the adjustment substrate has been completed. When it is determined that the imprinting process has not been completed, the process flow returns to S2004, and the processes of S2004 to S2016 are performed on a next measuring shot area. On the other hand, when it is determined that the imprinting process has been completed, the process flow proceeds to S2020.

Then, in S2020, the control unit CNT first reads the optimal illumination condition adjusted in the first illumination step for each of the plurality of measuring shot areas and stored in the storage medium such as a memory or a secondary storage device. Then, the approximate illumination condition of an approximate shot area different from the plurality of measuring shot areas is derived through function approximation (a derivation step). High-order or low-order approximation may be used as the function approximation. Then, the derived approximate illumination condition is stored in the storage medium such as the memory. The derived approximate illumination condition may be stored in a storage medium such as the second storage device connected to the imprint apparatus 100 in a wired or wireless manner. The measuring shot area which is a first shot area and the approximate shot area which is a second shot area are shot areas in the same substrate.

Then, S2022 is the same as the process of S2004 and thus description thereof will be omitted. Then, in S2024, the control unit CNT reads (acquires) the approximate illumination condition derived in S2020 from the storage medium such as the memory or the secondary storage device and controls the adjustment unit such that the approximate illumination condition for illuminating the alignment marks of the mold and the substrate is set. This setting can be performed before S2030 in which die-by-die alignment is performed and which will be described later. This setting may be performed at the same time as or in cooperation with the process of S2026 or may be performed at the same time as or in cooperation with the process of S2028 which will be described later. Then, S2026 is performed and then S2028 is performed, but S2026 and S2028 are the same processes as S2006 and S2008 and thus description thereof will be omitted.

Then, in S2030, the control unit CNT calculates a relative position between the alignment marks AMM of the mold and the alignment marks AMW of the substrate on the basis of the detection result from the alignment scope 172. In order to calculate the relative position, first, the patterned part of the mold M is brought into contact with the imprint material R supplied onto the approximate shot areas. Then, the alignment marks AMM and the alignment marks AMW are illuminated on the basis of the derived approximate illumination condition (a second illumination step). Then, the substrate stage 164, the mold drive mechanism 134, the mold shape correcting mechanism 140, and the like are controlled such that die-by-die alignment is performed and positioning (a second positioning step) is performed. At this time, since the approximate illumination condition of the approximate shot area has been derived in S2020 in advance and setting of the approximate illumination condition has been completed in S2024, the illumination conditions of the alignment marks of the mold and the substrate do not have to be adjusted again in S2030. Accordingly, it is possible to enhance a throughput and to improve the productivity.

Thereafter, S2032 is performed and then S2034 is performed. S2032 and S2034 are the same as the processes of S2014 and S2016, and thus description thereof will be omitted. Then, in S2036, the control unit CNT determines whether the imprinting process on all the shot areas on the adjustment substrate has been completed. When it is determined that the imprinting process on all the shot areas on the adjustment substrate has not been completed, the process flow returns to S2022 and the same process is repeated. On the other hand, when it is determined that the imprinting process on all the shot areas on the adjustment substrate has been completed, the process flow proceeds to S2038. Finally, in S2038, the control unit CNT controls the delivery apparatus (not illustrated) such that the adjustment substrate is taken out.

The control unit CNT can adjust the transmittance according to the shot area in which a pattern is to be formed by driving the light amount adjusting mechanism 154 on the basis of the illumination condition (the optimal illumination condition and the approximate illumination condition) acquired through the aforementioned investigation. For example, even when the shot area in which a pattern is to be formed is a shot area in which a pattern is to be first formed in the substrate W, the control unit CNT can adjust the transmittance by driving the light amount adjusting mechanism such that measurement with the alignment scope 172 is possible in an appropriate state (an optimal state).

Here, the light amount adjusting mechanism 154 employs a filter such as a continuously variable ND filter that can continuously change the transmittance. When this filter is used, it takes time of several hundreds of msec to complete driving for changing the transmittance. Accordingly, in S1006, the control unit CNT starts adjustment for changing the transmittance by driving the light amount adjusting mechanism 154, and the process flow proceeds to S1008 without waiting for completion of the adjustment in S1006. That is, the driving for changing the transmittance is completed after S1008.

Then, in S1008, the control unit CNT controls the application mechanism 180 such that the imprint material R is supplied (applied) to the shot area in which a pattern is to be formed. The imprint material R may be supplied to the whole surface of the substrate W in advance using an external apparatus as described above. In this case, the process of S1008 is not necessary.

Then, in S1010, the control unit CNT moves the alignment scope 172 to a position of the alignment marks AMM on the mold M by driving the alignment stage mechanism 174.

Then, in S1012, the control unit CNT controls the mold operating mechanism 130 such that the mold M is lowered (moved in the −Z direction) to press (impress) the patterned part of the mold M on the imprint material R in the shot area. At this time, the patterned part of the mold M is filled with the imprint material R while maintaining a state in which the patterned part of the mold M is in contact with the imprint material R. A load when the patterned part of the mold M is pressed on the imprint material R can be controlled, for example, using a load sensor incorporated into the mold drive mechanism 134. The control unit CNT may control the substrate drive unit 160 such that the substrate W is raised (moved in the +Z direction) to bring the patterned part of the mold M into contact with the imprint material R in the shot area instead of moving the mold M.

Then, in S1014, the control unit CNT controls the alignment mechanism 170 such that alignment measurement is started. In the present embodiment, it is assumed that alignment measurement is performed using die-by-die alignment. Specifically, the control unit CNT controls the alignment mechanism 170 such that an image of the alignment marks AM is captured by the alignment scope 172 to acquire the image. Thereafter, the control unit CNT measures the relative positions between the alignment marks on the mold M and the substrate W on the basis of the acquired image. Then, the control unit CNT also measures a difference in shot shape (such as coordinates, rotation, magnification, and trapezoidal component) between the mold M and the substrate W on the basis of the measurement result of the alignment mark relative position.

Then, in S1016, the control unit CNT perform alignment of the alignment marks AMM of the mold M and the alignment marks AMW of the substrate W. At this time, the control unit CNT may control the substrate drive unit 160 such that the alignment is performed by moving the substrate W. The control unit CNT may control the mold operating mechanism 130 such that the alignment is performed by moving the mold M. The control unit CNT may control both the substrate drive unit 160 and the mold operating mechanism 130 such that the alignment is performed by moving the substrate W and the mold M. In S1016, the control unit CNT controls the mold shape correcting mechanism 140 such that the shape of the mold M is corrected. The correction of the mold M in S1016 may be performed, for example, when a threshold value set for an amount of deformation of the substrate W is equal to or greater than a predetermined amount at a time point of S1016. In this case, a sensor or the like that can measure the amount of deformation of the mold M may be provided in the mold chuck 132 or the mold shape correcting mechanism 140.

Then, in S1018, the control unit CNT determines whether a light amount of the image captured by the alignment scope 172 in S1014 is equal to or greater than a predetermined threshold value. In other words, the control unit CNT determines whether the light amount of the image captured by the alignment scope 172 in S1014 is outside of a preset tolerance (allowance) range. When it is determined that the light amount of the image is equal to or greater than the predetermined threshold value, it is determined that the light amount of the image is inside of the preset tolerance range, and the process flow proceeds to S1020. On the other hand, when it is determined that the light amount of the image is less than the predetermined threshold value, it is determined that the light amount of the image is outside of the preset tolerance range, and the process flow proceeds to S1022. When it is determined that the light amount of the image is less than the predetermined threshold value, the control unit CNT does not adjust the light amount of light emitted from the light source 152 at least before the imprint material R is cured. That is, adjustment of the transmittance is not performed by driving the light amount adjusting mechanism 154 before the imprint material R is cured in S1030 which will be described later.

Then, in S1020, the control unit CNT controls the light amount adjusting mechanism 154 such that the light amount is inside of the tolerance range, and starts driving for changing the transmittance. That is, in S1020, the control unit CNT adjusts the light amount of light emitted from the light source 152 on the basis of the light amount of the image captured by the alignment scope 172. In S1020, similarly to S1006, the control unit CNT starts adjustment for changing the transmittance by driving the light amount adjusting mechanism 154, and the process flow proceeds to S1022 which is a next step without waiting for completion of the adjustment. That is, the adjustment for changing the transmittance is completed after S1022.

Then, in S1022, the control unit CNT determines whether a difference in shot shape between the mold M and the substrate W is equal to or greater than a predetermined threshold value. In other words, the control unit CNT determines whether the difference in shot shape between the mold M and the substrate W is outside of a preset tolerance (allowance) range. When it is determined that the difference in shot shape is less than the predetermined threshold value, it is determined that the difference in shot shape between the mold M and the substrate W is inside of the preset tolerance range, and the process flow proceeds to S1024. ON the other hand, when the difference in shot area is equal to or greater than the predetermined threshold value, it is determined that the difference in shot shape between the mold M and the substrate W is outside of the preset tolerance range, and the process flow returns to S1014 to perform the same process again. When the process flow returns to S1014 from S1022, mold shape correction is performed until the difference in shot shape between the mold M and the substrate W becomes inside of the preset tolerance range. The determination of S1022 is performed because a correction error may be caused due to a drive error or the like of the mold shape correcting mechanism 140 when shape correction of the mold M is performed by the mold shape correcting mechanism 140.

Then, in S1024, the control unit CNT determines whether driving for changing the transmittance of the light amount adjusting mechanism 154 has been completed. When it is determined that the driving for changing the transmittance of the light amount adjusting mechanism 154 has been completed, the process flow proceeds to S1028. On the other hand, when it is determined that the driving for changing the transmittance of the light amount adjusting mechanism 154 has not been completed, the process flow proceeds to S1026. As described above, the transmittance of the light amount adjusting mechanism 154 can be continuously adjusted. Accordingly, even when the driving for changing the transmittance has not been completed, the alignment measurement of S1014 can be started, and the process flow can proceed to a subsequent step (a step of S1014 or subsequent thereto) while the driving for changing the transmittance is being performed. Here, since a final overlay may be affected when the driving for changing the transmittance is not completed until the imprint material R is cured, it is determined in this step whether the driving for changing the transmittance has been completed.

Then, in S1026, the control unit CNT notifies of an error. That is, a user is notified of an error. In the notification of an error, for example, a message indicating that adjustment of the transmittance in the shot area in which the error has occurred has not been completed may be displayed on a display or the like of an information terminal such as a PC that is operated by the user. For example, as illustrated in FIG. 5, a layout indicating the substrate W and an arrangement of the shot areas may be displayed on a display or the like, and a shot area from which an error has occurred may be displayed on the layout to be presented to the user. At this time, the shot area from which an error has occurred may be set to a color different from that of the shot areas from which no error has occurred, may be hatched, or may be made to flicker. The control unit CNT records information of the shot area on which the imprinting process is performed at the time point at which an error has been notified of on a recording medium such as a memory. By recording the notification of an error and the notified error in this way, the user can ascertain, for example, from which shot area an error has occurred after the imprinting process on all the shot areas has been completed.

Then, in S1028, the control unit CNT controls the alignment mechanism 170 such that the alignment measurement ends. Then, in S1030, the control unit CNT controls the light irradiation mechanism 120 such that the imprint material R is cured by irradiating the imprint material R with UV light in a state in which the patterned part of the mold M is in contact with the imprint material R. The process of curing the imprint material R is performed in a state in which the alignment measurement has been performed and alignment control has been performed such that misalignment is corrected. After the patterned part of the mold M has been brought into contact with the imprint material R in S1012, the state in which the patterned part of the mold M is in contact with the imprint material R is maintained up to a timing of release of S1034 which will be described later.

Then, in S1032, the control unit CNT drives the light amount adjusting mechanism 154 such that the transmittance is adjusted to satisfy the illumination condition for illuminating a shot area in which the pattern is to be next formed using the alignment mechanism 170. Specifically, after the imprint material R has been cured in a state in which positioning (alignment) between the mold M and the substrate W has been performed on the basis of the result of alignment measurement, the light amount adjusting mechanism 154 is driven such that the transmittance is adjusted. Here, the control unit CNT drives the light amount adjusting mechanism 154 to a target transmittance in the shot area in which the pattern is to be next formed at the time of starting of adjustment of the transmittance. The target transmittance is a transmittance which is determined on the basis of the illumination condition (the optimal illumination condition and the approximate illumination condition) investigated in advance and which is a target in the shot area in which the pattern is to be next formed. In S1032, similarly to S1006 and S1020, the control unit CNT drives the light amount adjusting mechanism 154 such that adjustment for changing the transmittance is started, and the process flow proceeds to S1034 which is a subsequent step without waiting for completion of the adjustment. That is, the driving for changing the transmittance is completed after S1034.

Then, in S1034, the control unit CNT controls the mold operating mechanism 130 such that the patterned part of the mold M is separated (released) from the imprint material R by raising the mold M (by moving the mold M in the +Z direction). The control unit CNT may control the substrate drive unit 160 such that the patterned part of the mold M is separated from the imprint material R by lowering the substrate W (moving the substrate W in the −Z direction) instead of moving the mold M.

As described above, in S1032, adjustment of the transmittance is started such that the illumination condition for illuminating the shot area in which the pattern is to be next formed using the alignment mechanism 170 is satisfied. That is, before S1034 is started, the adjustment of the transmittance is performed by the light amount adjusting mechanism 154 on the basis of the result of alignment measurement after the imprint material has been cured in a state in which the mold M and the substrate W have been aligned and before separation (a release process) of the mold M and the substrate W is completed.

Then, in S1036, the control unit CNT determines whether the imprinting process on all the shot areas of the substrate W has been completed. When it is determined that the imprinting process on all the shot areas of the substrate W has not been completed, the process flow returns to S1008, and the same process as described above is performed on the shot area in which the imprinting process is to be next performed. On the other hand, when it is determined that the imprinting process on all the shot areas of the substrate W has been completed, the process flow proceeds to S1038. Then, in S1038, the substrate W is unloaded from the substrate chuck 162 using a delivery mechanism which is not illustrated.

In this way, in the process according to the present embodiment, the control unit CNT drives the light amount adjusting mechanism 154 such that the transmittance is adjusted in S1006 and S1032. The transmittance is also adjusted in S1020 according to the determination result. In other words, in the present embodiment, the control unit CNT drives the light amount adjusting mechanism 154 to adjust the transmittance at one or more of a timing before a pattern is formed in a shot area, a timing after alignment measurement has been completed, and a timing after the imprint material R has been cured.

In the present embodiment, it is determined in S1024 whether driving for changing the transmittance of the light amount adjusting mechanism 154 has been completed, and an error is notified of when the driving for changing the transmittance has not been completed. Here, when the driving for changing the transmittance has not been completed, an error may not be notified of and the alignment measurement may be started again in S1014. In this case, the processes of S1014 to S1024 may be repeated until the driving for changing the transmittance of the light amount adjusting mechanism 154 is completed. When the driving for changing the transmittance has not been completed, the alignment measurement may be started again in S1014 while notifying of an error.

The driving for changing the transmittance of the light amount adjusting mechanism 154 can be performed using in an area with a low transmittance such that a driving time for a desired light amount can be shortened. Accordingly, when the driving for changing the transmittance of the light amount adjusting mechanism 154 is performed in an area with a low transmittance, it is preferable that an intensity of the light source 152 of the alignment illumination mechanism 150 be increased as much as possible. That is, the control unit CNT increases a light intensity of light emitted from the light source 152 when the light amount of light emitted from the light source 152 is adjusted using an area with a low transmittance in the light amount adjusting mechanism 154. By increasing the intensity of the light source 152, the light amount adjusting mechanism 154 can be used in an area with a low transmittance.

When the difference in shot shape (a difference in shot and shape) between the mold M and the substrate W is inside of a preset tolerance range in S1022, the process flow proceeds to the next step (S1024). However, the present invention is not limited thereto, and the next step may be performed when a predetermined time has elapsed after alignment start has been started.

With the imprint apparatus 100 according to the present embodiment described above, it is possible to perform measurement and imaging using the alignment scope 172 in an appropriate state (an optimal state) by changing the transmittance on the basis of the illumination condition for each shot area investigated in advance. Accordingly, it is possible to provide an imprint apparatus 100 that can curb a decrease in throughput and accurately perform an imprinting process because an amount of inflow gas such as helium for prompting filling is not changed for each shot.

Embodiment of Article Manufacturing Method

An article manufacturing method according to the present embodiment is suitably used, for example, to manufacture a micro device such as a semiconductor device or an article such as a device having a microstructure. The article manufacturing method according to the present embodiment includes a step of forming a pattern in a composition applied onto a substrate using the imprint apparatus 100 (a step of processing a substrate) and a step of processing the substrate on which the pattern has been formed through this step. This manufacturing method includes other known steps (such as oxidation, film formation, deposition, doping, planarization, etching, composition separation, dicing, bonding, and packaging). The article manufacturing method according to the present embodiment is advantageous in at least one of performance, quality, productivity, and production cost of an article in comparison with the related art.

A pattern of a cured material shaped using the imprint apparatus 100 is permanently used as at least a part of various articles or is temporarily used to manufacture various articles. Examples of the article include an electrical circuit device, an optical device, an MEMS, a recording device, a sensor, and a mold. Examples of the electrical circuit element include volatile or nonvolatile semiconductor memories such as a DRAM, an SRAM, a flash memory, or an MRAM and semiconductor devices such as an LSI, a CCD, an image sensor, and an FPGA. An example of the mold is a mold for processing a substrate such as imprinting.

The pattern of a cured material is used as a constituent of at least a part of the article without any change or is temporarily used as a composition mask. The composition mask is removed after etching, ion implantation, or the like has been performed thereon in the step of processing a substrate.

Figure 7A:
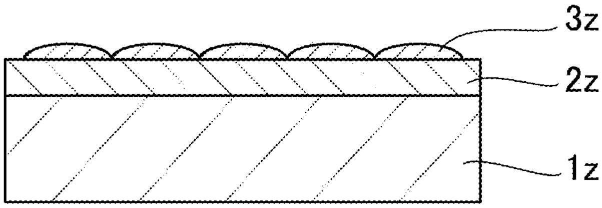
FIGS. 7A to 7F are diagrams schematically illustrating an article manufacturing method.

The article manufacturing method will be specifically described below with reference to FIG. 7. As illustrated in FIG. 7A, a substrate 1*z* such as a silicon substrate in which a processing material 2*z* such as an insulator is formed on the surface thereof is prepared, and a composition 3*z* is applied to the surface of the processing material 2*z* using an ink jet method or the like. Here, a state in which the composition 3*z* with a shape of a plurality of liquid droplets is applied onto the substrate 1*z* is illustrated.

Figure 7B:
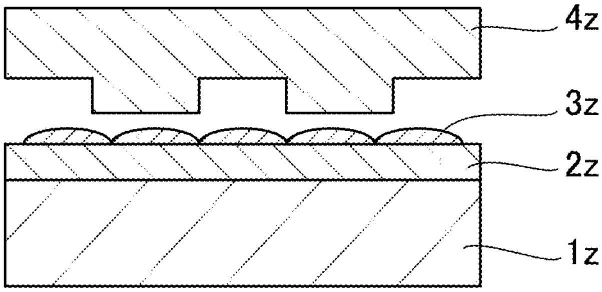
Figure 7C:
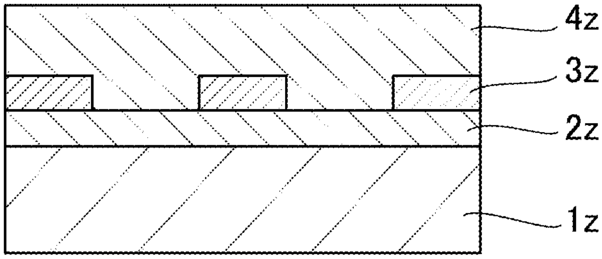

As illustrated in FIG. 7B, a mold 4*z* is provided such that a side on which a protruded/recessed pattern is formed faces the composition 3*z* on the substrate 1*z*. As illustrated in FIG. 7C, the substrate 1*z* to which the composition 3*z* is applied is brought into contact with the mold 4*z*, and a pressure is applied thereto (a contact step). The composition 3*z* is filled in gaps between the mold 4*z* and the processing material 2*z*. When light which is curing energy is applied through the mold 4*z* in this state, the composition 3*z* is cured (a curing step). At this time, in the present embodiment, the composition can be irradiated with light with an amount of irradiation for optimal photopolymerization on the basis of spectral sensitivity characteristics acquired in the apparatus.

Figure 7D:
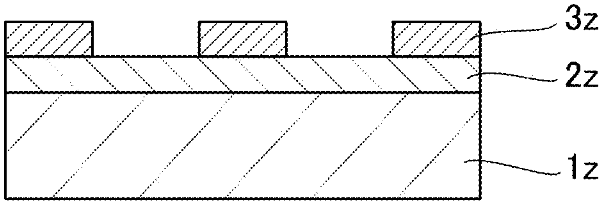

As illustrated in FIG. 7D, when the mold 4*z* and the substrate 1*z* are separated from each other after the composition 3*z* has been cured, a pattern of the cured composition 3*z* is formed on the substrate 1*z* (a pattern forming step, a shaping step). This pattern of the cured composition has a shape in which the recessed parts of the mold 4*z* correspond to the protruded parts of the cured composition and the protruded parts of the mold 4*z* correspond to the recessed parts of the cured composition, that is, the protruded/recessed pattern of the mold 4*z* is transferred to the composition 3*z*.

Figure 7E:
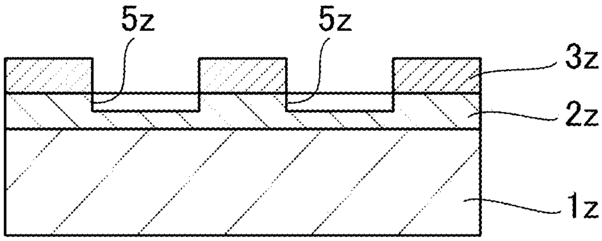
Figure 7F:
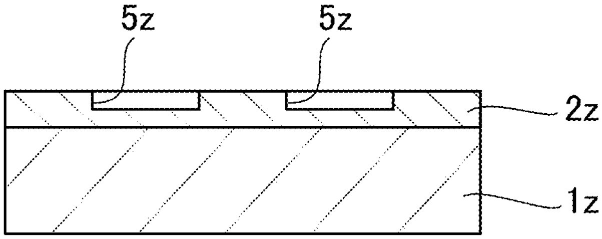

As illustrated in FIG. 7E, when etching is performed using the pattern of the cured composition as an etching-resistant mask, parts in which there is no cured composition or parts in which a thin cured composition remains on the surface of the processing material 2*z* are removed to form grooves 5*z*. As illustrated in FIG. 7F, when the pattern of the cured composition is removed, it is possible to obtain an article in which the grooves 5*z* are formed on the surface of the processing material 2*z*. The pattern of the cured composition is removed herein, but the pattern of the cured composition may be used as an interlayer insulating film included in a semiconductor device or the like, that is, a constituent of an article, without being removed after the processing. An example in which a mold for transferring a circuit pattern on which a protruded/recessed pattern is provided is use as the mold 4*z* has been described above, but the mold may be a planar template including a planar part without a protruded/recessed pattern.

While exemplary embodiments of the present invention have been described above, the present invention is not limited to the embodiments and can be modified and changed in various forms within the scope of the gist thereof. The embodiments may be combined for implementation.

A computer program for realizing functions of the embodiments including partial or whole control in the embodiments may be supplied to the imprint apparatus 100 or the like via a network or various storage media. A computer (or a CPU or an MPU) in the imprint apparatus 100 or the like may read and execute the computer program. In this case, the computer program and a storage medium storing the computer program constitute the present invention.

While the present invention has been described with reference to exemplary embodiments, it is to be understood that the invention is not limited to the disclosed exemplary embodiments. The scope of the following claims is to be accorded the broadest interpretation so as to encompass all such modifications and equivalent structures and functions.

This application claims the benefit of Japanese Patent Application No. 2023-127248, Aug. 3, 2023, which is hereby incorporated by reference wherein in its entirety.

What is claimed is:

1. An imprint apparatus for curing and forming a pattern of an imprint material sequentially in a plurality of shot areas on a substrate using a mold including a patterned part, the imprint apparatus comprising:

an alignment measurement unit configured to measure a relative position between the substrate and the mold by detecting a first mark formed on the substrate and a second mark formed on the mold;

an alignment illumination unit including a light amount adjusting mechanism for adjusting a light amount of light emitted from a light source and configured to illuminate the first and second marks such that the first and second marks are detectable by the alignment measurement unit; and a control unit configured to:

cure the imprint material in a state in which the mold and the substrate have been aligned on the basis of a measurement result from the alignment measurement unit; and then perform control such that adjustment of the light amount adjusting mechanism is started such that an illumination condition when the alignment illumination unit illuminates a shot area on which a pattern is to be next formed is satisfied.

2. The imprint apparatus according to claim 1, wherein the control unit starts the adjustment of the light amount adjusting mechanism such that the illumination condition when the alignment illumination unit illuminates a shot area on which a pattern is to be next formed is satisfied after the imprint material has been cured in a state in which the mold and the substrate have been aligned on the basis of a measurement result from the alignment measurement unit and before separation of the mold and the substrate is completed.

3. The imprint apparatus according to claim 1, wherein:

the light amount adjusting mechanism is able to continuously adjust a transmittance, and the control unit sets the illumination condition by driving the light amount adjusting mechanism to adjust the transmittance.

4. The imprint apparatus according to claim 3, wherein the control unit drives the light amount adjusting mechanism to a target transmittance of a shot area on which a pattern is to be next formed after curing the imprint material.

5. The imprint apparatus according to claim 3, wherein the control unit adjusts the transmittance by driving the light amount adjusting mechanism at one of a timing before a pattern is formed in the shot area, a timing after measurement in the alignment measurement unit has been completed, or a timing after the imprint material has been cured.

6. The imprint apparatus according to claim 3, wherein the control unit adjusts the transmittance by driving the light amount adjusting mechanism such that measurement is able to be appropriately performed by the alignment measurement unit when a pattern is first formed in one out of the plurality of shot areas.

7. The imprint apparatus according to claim 3, wherein the control unit notifies of an error when adjustment of the transmittance is not completed before curing the imprint material.

8. The imprint apparatus according to claim 1, wherein:

the alignment measurement unit includes an alignment scope for imaging the first and second marks and acquiring an image, and the control unit adjusts a light amount of light emitted from the light source on the basis of a light amount of the image captured by the alignment scope when the light amount adjusting mechanism is driven after the relative position has been measured by the alignment measurement unit.

9. The imprint apparatus according to claim 8, wherein the control unit does not adjust a light amount of light emitted from the light source at least before the imprint material has been cured when a light amount of the image is equal to or greater than a threshold value.

10. The imprint apparatus according to claim 1, wherein:

the light amount adjusting mechanism includes a plurality of areas with different transmittances, and the control unit increases a light intensity of light emitted from the light source when a light amount of light emitted from the light source is adjusted using an area with a low transmittance in the light amount adjusting mechanism.

11. The imprint apparatus according to claim 1, wherein the light amount adjusting mechanism is a continuously variable ND filter.

12. The imprint apparatus according to claim 1, wherein the light amount adjusting mechanism is a liquid crystal ND filter.

13. An imprint method of curing and forming a pattern of an imprint material sequentially in a plurality of shot areas on a substrate using a mold including a patterned part, the imprint method comprising:

a measurement step of measuring a relative position between the substrate and the mold by detecting a first mark formed on the substrate and a second mark formed on the mold;

an illumination step of illuminating the first and second marks such that the first and second marks are detectable in the measurement step using a light amount adjusting mechanism for adjusting a light amount of light emitted from a light source; and a control step of:

curing the imprint material in a state in which the mold and the substrate have been aligned on the basis of a measurement result of the measurement step; and then performing control such that adjustment of the light amount adjusting mechanism is started to satisfy an illumination condition when a shot area on which a pattern is to be next formed is illuminated in the illumination step.

14. An article manufacturing method that is performed by an imprint apparatus for curing and forming a pattern of an imprint material sequentially in a plurality of shot areas on a substrate using a mold including a patterned part, the imprint apparatus comprising:

an alignment measurement unit configured to measure a relative position between the substrate and the mold by detecting a first mark formed on the substrate and a second mark formed on the mold;

an alignment illumination unit including a light amount adjusting mechanism for adjusting a light amount of light emitted from a light source and configured to illuminate the first and second marks such that the first and second marks are detectable by the alignment measurement unit; and a control unit configured to:

cure the imprint material in a state in which the mold and the substrate have been aligned on the basis of a measurement result from the alignment measurement unit; and then perform control such that adjustment of the light amount adjusting mechanism is started to satisfy an illumination condition when the alignment illumination unit illuminates a shot area on which a pattern is to be next formed, the article manufacturing method comprising:

a pattern forming step of forming a protruded/recessed pattern on the substrate using the imprint apparatus;

a processing step of processing the substrate on which the pattern has been formed in the pattern forming step; and a process of manufacturing an article from the substrate processed in the processing step.

* * * * *